(12) United States Patent
Jo

(10) Patent No.: US 10,783,976 B2
(45) Date of Patent: Sep. 22, 2020

(54) ANTIFUSE MEMORY DEVICE AND OPERATION METHOD THEREOF

(71) Applicant: SK hynix Inc., Icheon (KR)

(72) Inventor: Hyeon-Ja Jo, Cheongju (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/453,943

(22) Filed: Jun. 26, 2019

(65) Prior Publication Data

US 2019/0392911 A1    Dec. 26, 2019

(30) Foreign Application Priority Data

Jun. 26, 2018 (KR) .................. 10-2018-0073185

(51) Int. Cl.
| | |
|---|---|
| *G11C 17/16* | (2006.01) |
| *G11C 17/18* | (2006.01) |
| *G11C 8/10* | (2006.01) |
| *G11C 8/08* | (2006.01) |
| *G11C 7/12* | (2006.01) |
| *G11C 7/08* | (2006.01) |

(52) U.S. Cl.
CPC .............. *G11C 17/16* (2013.01); *G11C 7/08* (2013.01); *G11C 7/12* (2013.01); *G11C 8/08* (2013.01); *G11C 8/10* (2013.01); *G11C 17/18* (2013.01)

(58) Field of Classification Search
CPC .......... G11C 17/16; G11C 17/18; G11C 7/08; G11C 8/08; G11C 7/12; G11C 8/10
See application file for complete search history.

(56) References Cited

U.S. PATENT DOCUMENTS

| 8,699,256 B2 * | 4/2014 | Kubouchi .............. G11C 17/18 365/200 |
| 9,570,192 B1 * | 2/2017 | Yoon ........................ G11C 8/08 |
| 2015/0206594 A1 * | 7/2015 | Hoefler ................ G11C 29/027 365/96 |

FOREIGN PATENT DOCUMENTS

| KR | 20100082046 A | 7/2010 |
| KR | 101752151 B1 | 6/2017 |

* cited by examiner

*Primary Examiner* — Gene N Auduong

(57) ABSTRACT

A memory device includes a memory cell array comprising a plurality of antifuse memory cells coupled to a plurality of word lines, a plurality of voltage lines and a plurality of bit lines, and a first decoder suitable for generating a word line driving signal associated with a target memory cell among the plurality of antifuse memory cells in response to a first address, and asserting the word line driving signal at least twice during a program operation.

20 Claims, 5 Drawing Sheets

ANTIFUSE MEMORY DEVICE AND OPERATION METHOD THEREOF

CROSS-REFERENCE TO RELATED APPLICATION

This application claims priority under 35 U.S.C. § 119 to Korean Patent Application No. 10-2018-0073185 filed on Jun. 26, 2018, which is incorporated herein by reference in its entirety.

BACKGROUND

1. Field

Embodiments relate to a memory device and an operation method thereof, and more particularly, to an antifuse memory device which performs a program operation by sharing a switch for accessing an antifuse memory cell.

2. Discussion of the Related Art

A memory system is applied to various electronic devices for consumer or industry use, for example, a computer, a mobile phone, a portable digital assistant (PDA), a digital camera, a game console, a navigation system, and the like, and used as a main memory device or a secondary memory device. Memory devices for implementing the memory system may be divided into volatile memory devices such as a dynamic random access memory (DRAM) and a Static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magnetoresistive RAM (MRAM), a resistive RAM (RRAM), and a flash memory.

The volatile memory devices cannot retain data stored therein when power is turned off. On the other hand, the nonvolatile memory devices can retain data stored therein even though power is turned off. Among the nonvolatile memory devices, the ROM is a one-time programmable ROM (OTP ROM), and may store information by selectively cutting one or more metal fuses among a plurality of metal fuses or selectively coupling one or more antifuses among a plurality of antifuses.

In particular, an antifuse may be coupled through a process of breaking a dielectric material by applying a high voltage to a metal oxide semiconductor (MOS) capacitor. Depending on whether the antifuse is coupled, the antifuse may be programmed. Furthermore, a current flowing through the antifuse may be sensed to read the logical value of data stored in the antifuse.

As the integration density of a memory system is increased, the number of memory cells constituting the memory system is also increased. As the number of memory cells increases, a circuit area (i.e., an area of an antifuse memory device included in the memory system) for intellectual property (IP) increases. The increase in the area of the antifuse memory device may have an influence on the layout of the memory system. Therefore, research is being conducted on a method capable of retaining the reliability of the antifuse memory device while reducing the area of the antifuse memory device.

SUMMARY

Various embodiments are directed to an antifuse memory device which can share a switch for accessing an antifuse memory cell, thereby reducing an area thereof and improving reliability of a program operation, and an operation method thereof.

In an embodiment of the present disclosure, a memory device includes: a memory cell array comprising a plurality of antifuse memory cells coupled to a plurality of word lines, a plurality of voltage lines and a plurality of bit lines; and a first decoder suitable for generating a word line driving signal associated with a target memory cell among the plurality of antifuse memory cells in response to a first address, and asserting the word line driving signal at least twice during a program operation.

In accordance with an embodiment of the present disclosure, a memory cell includes: first and second antifuse transistors coupled in parallel between a floating node and a common node; and a select transistor coupled between the common node and a bit line, wherein the select transistor is turned on at first and second times to sequentially program the first and second antifuse transistors during a program operation.

In accordance with an embodiment of the present disclosure, a method for operating a memory device includes: generating a word line driving signal associated with a target memory cell among a plurality of memory cells in response to a row address, wherein the word line driving signal is asserted at least twice during a program operation, the program operation including first and second programming sub-operations; performing the first programming sub-operating on the target memory cell in response to the word line driving signal asserted at a first time; and performing the second programming sub-operating on the target memory cell in response to the word line driving signal asserted at a second time.

DETAILED DESCRIPTION

Figure 1:
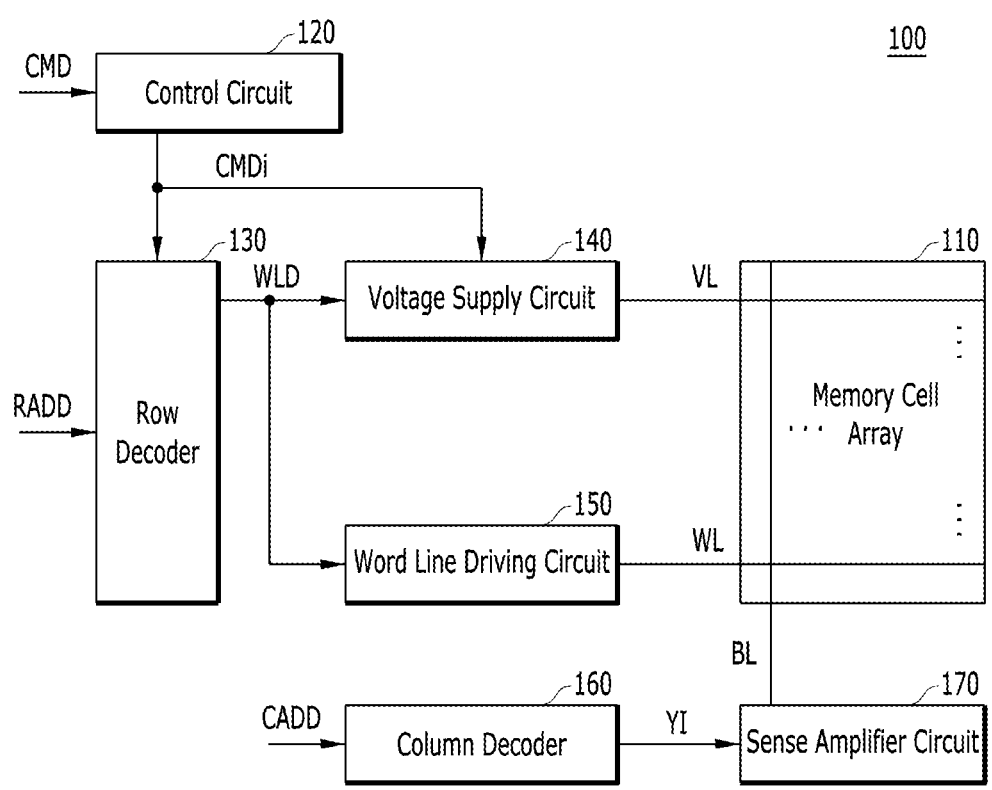
FIG. 1 is a block diagram illustrating a memory device in accordance with an embodiment of the present disclosure.

Various embodiments will be described below in more detail with reference to the accompanying drawings. Embodiments of the present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Moreover, detailed descriptions related to well-known functions or configurations may be omitted in order to clearly describe the subject matters of the present disclosure. Throughout the disclosure, like reference numerals refer to like parts throughout the various figures and embodiments of the present disclosure.

FIG. 1 is a block diagram illustrating a memory device 100 in accordance with an embodiment of the prevent disclosure. Referring to FIG. 1, the memory device 100 may include a memory cell array 110 including a plurality of memory cells and operation circuits 120, 130, 140, 150, 160, and 170 for performing a program operation and a read operation on the plurality of memory cells.

The memory cell array 110 may include a plurality of antifuse memory cells arranged in a first direction (e.g., a row direction) and a second direction (e.g., a column direction). The plurality of antifuse memory cells may be coupled between a plurality of voltage lines VL and a plurality of word lines WL and a plurality of bit lines BL. For example, each of the plurality of antifuse memory cells may be coupled to two or more of the plurality of voltage lines VL and one or more of the plurality of word lines WL, where each of the plurality of voltage lines VL and the plurality of word lines WL extends in the row direction. Each of the plurality of antifuse memory cells may be also coupled to each of the plurality of bit lines BL that extends in the column direction. However, embodiments of the present disclosure are not limited thereto. The structure of the memory cell array 110 will be described below in more detail with reference to FIGS. 2A and 3A.

The operation circuits 120, 130, 140, 150, 160, and 170 may correspond to a control circuit 120, a row decoder 130, a voltage supply circuit 140, a word line driving circuit 150, a column decoder 160, and a sense amplifier circuit 170, respectively. The control circuit 120 may generate an internal command signal CMDi for performing a program operation or a read operation in response to a command CMD inputted from outside.

The row decoder 130 may select a target word line among the plurality of word lines WL of the memory cell array 110 in response to a row address RADD. That is, the row decoder 130 may generate a word line driving signal WLD associated with a target memory cell among a plurality of antifuse memory cells of the memory cell array 110 by decoding the row address RADD. In accordance with an embodiment of the present disclosure, when the control circuit 120 outputs the internal command signal CMDi to the row decoder 130 during a program operation, the row decoder 130 may generate the word line driving signal WLD of the target memory cell and activate (or assert) the word line driving signal WLD at least twice during the program operation.

The voltage supply circuit 140 may generate a program voltage (e.g., a high voltage VPP in FIG. 2B), a read voltage, or both in response to the internal command signal CMDi generated by the control circuit 120. For example, the voltage supply circuit 140 may supply the program voltage or the read voltage to two or more of the voltage lines VL according to the word line driving signal WLD generated by the row decoder 130. For example, during a program operation, the voltage supply circuit 140 may generate a high voltage (e.g., a high voltage VPP in FIG. 2B) and supply the generated high voltage to the corresponding voltage lines VL.

The word line driving circuit 150 may drive one or more word lines WL to the level of a power supply voltage (e.g., a power supply voltage VDD in FIG. 2B) or a core voltage according to the word line driving signal WLD generated by the row decoder 130. For example, the word line driving circuit 150 may enable (or drive) one word line coupled to the target memory cell in response to the word line driving signal WLD.

The column decoder 160 may select a target bit line among the plurality of bit lines BL of the memory cell array 110 in response to a column address CADD. That is, the column decoder 160 may generate a bit line select signal YI of the target memory cell among the plurality of antifuse memory cells of the memory cell array 110 by decoding the column address CADD. For example, the bit line select signal YI is used to select a specific bit line (e.g., a first bit line BL1 in FIG. 2A) coupled to the target memory cell (e.g., the first antifuse memory cell MC11a in FIG. 2A).

The sense amplifier circuit 170 may be coupled to the memory cell array 110 through the plurality of bit lines BL. The sense amplifier circuit 170 may sense and amplify data of the target memory cell which is accessed according to the bit line select signal YI generated by the column decoder 160.

Figure 2A:
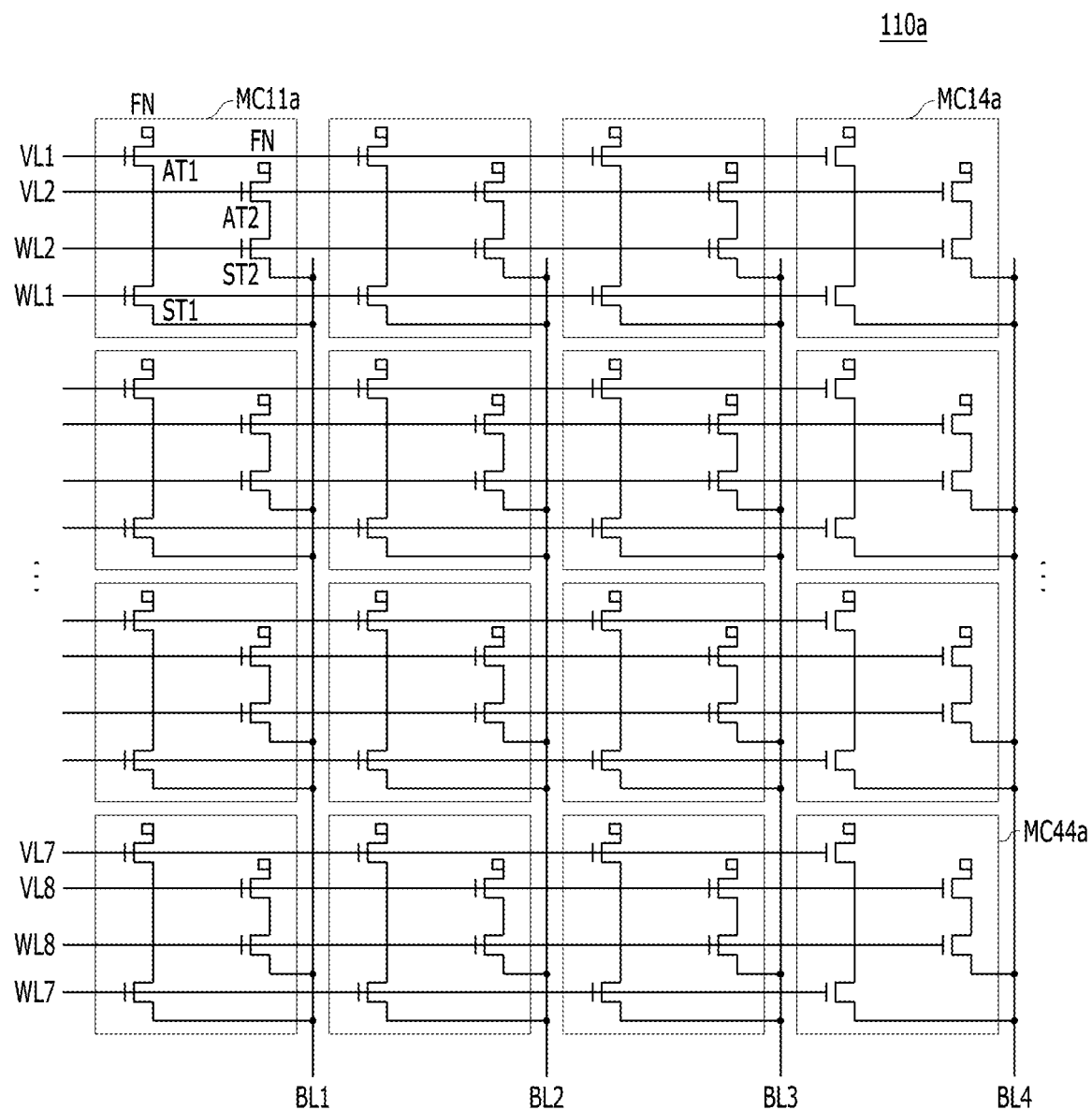
FIG. 2A is a circuit diagram illustrating a memory cell array of FIG. 1 in accordance with an embodiment of the present disclosure.

FIG. 2A is a circuit diagram illustrating a memory cell array 110a suitable for use as the memory cell array 110 of FIG. 1 in accordance with an embodiment of the prevent disclosure. As described above, the memory cell array 110 may include a plurality of antifuse memory cells arranged in the row and column directions to have a matrix shape. Although FIG. 2A illustrates the memory cell array 110a having a 4*4 matrix shape, embodiments of the present disclosure are not limited thereto.

The memory cell array 110a may include a plurality of antifuse memory cells MC11a to MC44a, which are coupled to a plurality of word lines WL1 to WL8, a plurality of voltage lines VL1 to VL8, and a plurality of bit lines BL1 to BL4. Specifically, each of the plurality of antifuse memory cells MC11a to MC44a is coupled to a pair of the plurality of word lines WL1 to WL8, a pair of the plurality of voltage lines VL1 to VL8, and one of the plurality of bit lines BL1 to BL4. In the embodiment shown in FIG. 2A, each of the antifuse memory cells MC11a to MC44a may include two antifuse transistors (e.g., first and second antifuse transistors AT1 and AT2 in FIG. 2A) to be programmed and two select transistors (e.g., first and second select transistors ST1 and ST2 in FIG. 2A) for selecting a corresponding one of the antifuse transistors.

For the purpose of convenience, a configuration of the first antifuse memory cell MC11a will be described hereinafter. The first antifuse memory cell MC11a may include a first antifuse transistor AT1 and a first select transistor ST1. The first antifuse transistor AT1 may be programmed according to a voltage applied to a first voltage line VL1, and the first select transistor ST1 may select the first antifuse transistor AT1 according to a voltage applied to a first word line WL1. The first antifuse memory cell MC11a may further include a second antifuse transistor AT2 and a second select transistor ST2. The second antifuse transistor AT2 may be programmed according to a voltage applied to a second voltage line VL2, and the second select transistor ST2 may select the second antifuse transistor AT2 according to a voltage applied to a second word line WL2.

Specifically, the first antifuse transistor AT1 and the first select transistor ST1 may be coupled in series between a floating node FN and a first bit line BL1. The first antifuse transistor AT1 and the first select transistor ST1 may have control terminals (e.g., gate terminals) coupled to the first voltage line VL1 and the first word line WL1, respectively. The second antifuse transistor AT2 and the second select transistor ST2 may be coupled in series between the floating node FN and the first bit line BL1. Gate terminals of the second antifuse transistor AT2 and the second select transistor ST2 are coupled to the second voltage line VL2 and the second word line WL2, respectively. Although the first and second antifuse transistors AT1 and AT2 are coupled to the same floating node FN in the embodiment shown in FIG. 2A, embodiments of the present disclosure are not limited thereto. For example, the first and second antifuse transistors AT1 and AT2 may be coupled to different floating nodes.

The first antifuse memory cell MC11a may include two antifuse transistors AT1 and AT2 and two select transistors ST1 and ST2. A programming operation may be performed on the first and second antifuse transistors AT1 and AT2, rather than on a single antifuse transistor, thereby improving reliability of performing the program operation on the first antifuse memory cell MC11a to store data therein. For example, the program operation of the first antifuse memory cell MC11a may be performed in two steps.

Figure 2B:
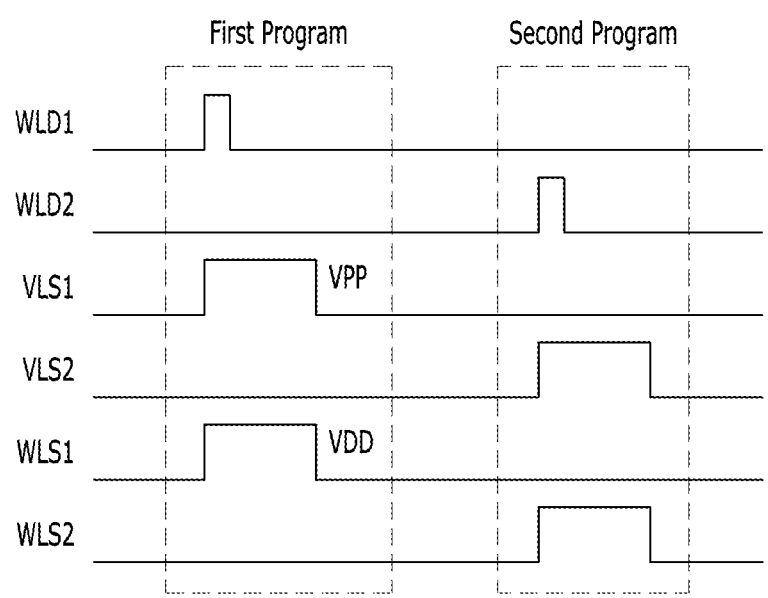
FIG. 2B includes waveforms illustrating a program operation of the memory cell array illustrated in FIG. 2A in accordance with an embodiment of the present disclosure.

FIG. 2B includes waveforms illustrating a program operation on the memory cell array 110a in FIG. 2A in accordance with an embodiment of the present disclosure. For the purpose of convenience, FIG. 2B illustrates a program operation on the first antifuse memory cell MC11a.

During the program operation, when the first antifuse memory cell MC11a is a target memory cell, the row decoder 130 in FIG. 1 may sequentially generate first and second word line driving signals WLD1 and WLD2 by decoding the row address RADD.

When the first word line driving signal WLD1 is activated (or asserted), the voltage supply circuit 140 in FIG. 1 may supply a program voltage (e.g., the high voltage VPP), to the first voltage line VL1, and the word line driving circuit 150 in FIG. 1 may drive the first word line WL1 to the level of a given voltage (e.g., the power supply voltage VDD), thereby enabling (or driving) the first word line WL1. That is, a first voltage line signal VLS1 is asserted to have the high voltage VPP and a first word line signal WLS1 is asserted to have the power supply voltage VDD in response to the asserted first word line driving signal WLD1. While the first word line WL1 is driven to the power supply voltage VDD, the first bit line BL1 coupled to the first antifuse memory cell MC11a is selected in response to the column address CADD. As a result, the first select transistor ST1 in FIG. 2A coupled to the first word line WL1 and the first bit line BL1 is turned on and a conductive channel is formed through a gate dielectric layer of the first antifuse transistor AT1 due to a dielectric breakdown forced by the high voltage VPP applied to the gate terminal thereof during a first program suboperation.

Then, when the second word line driving signal WLD2 is asserted, the voltage supply circuit 140 in FIG. 1 may supply the high voltage VPP to the second voltage line VL2, and the word line driving circuit 150 in FIG. 1 may drive the second word line WL2 to the level of the power supply voltage VDD. That is, a second voltage line signal VLS2 is asserted to have the high voltage VPP and a second word line signal WLS2 is asserted to have the power supply voltage VDD in response to the asserted second word line driving signal WLD2. Therefore, while the second select transistor ST2 is turned on and a conductive channel is formed through a gate dielectric layer of the second antifuse transistor AT2 due to a dielectric breakdown forced by the high voltage VPP applied to the gate terminal thereof during a second program suboperation.

A read operation may be performed on the first antifuse memory cell MC11a in two steps, similarly to the above-described program operation, except that the voltage supply circuit 140 in FIG. 1 supplies a read voltage to the first and second voltage lines VL1 and VL2 according to the internal command signal CMDi applied from the control circuit 120. For example, during a first read suboperation, the first select transistor ST1 is turned on in response to the first word line signal WLS1 asserted to have the power supply voltage VDD, and the first antifuse transistor AT1 receives the first voltage line signal VLS1 asserted to have the read voltage (not shown). During a second read suboperation, the second select transistor ST2 is turned on in response to the second word line signal WLS2 asserted to have the power supply voltage VDD, and the second antifuse transistor AT2 receives the second voltage line signal VLS2 asserted to have the read voltage (not shown). Through the read operation, the first antifuse memory cell MC11a may be determined as being programmed when any one of the first and second antifuse transistors AT1 and AT2 or both of the first and second antifuse transistors AT1 and AT2 are determined as being programmed.

Therefore, it is possible to compensate for an error which may occur during a program operation on any one of the first and second antifuse transistors AT1 and AT2. For example, even when an error occurs during the first program suboperation on the first antifuse transistor AT1, the second antifuse transistor AT2 may be programmed without an error during the second program suboperation, and vice versa, thereby improving reliability of the programming operation on the first antifuse memory cell MC11a. Furthermore, when a defect occurs in any one of the first and second antifuse transistors AT1 and AT2 (or the first and second select transistors ST1 and ST2) during a fabrication process, the defect can be repaired. For example, even when a defect occurs during a fabrication process on the first antifuse transistor AT1 of the first antifuse memory cell MC11a, a program operation may be performed on the second antifuse transistor AT2 of the first antifuse memory cell MC11a, thereby programming the first antifuse memory cell MC11a and repairing the defect thereof.

Figure 3A:
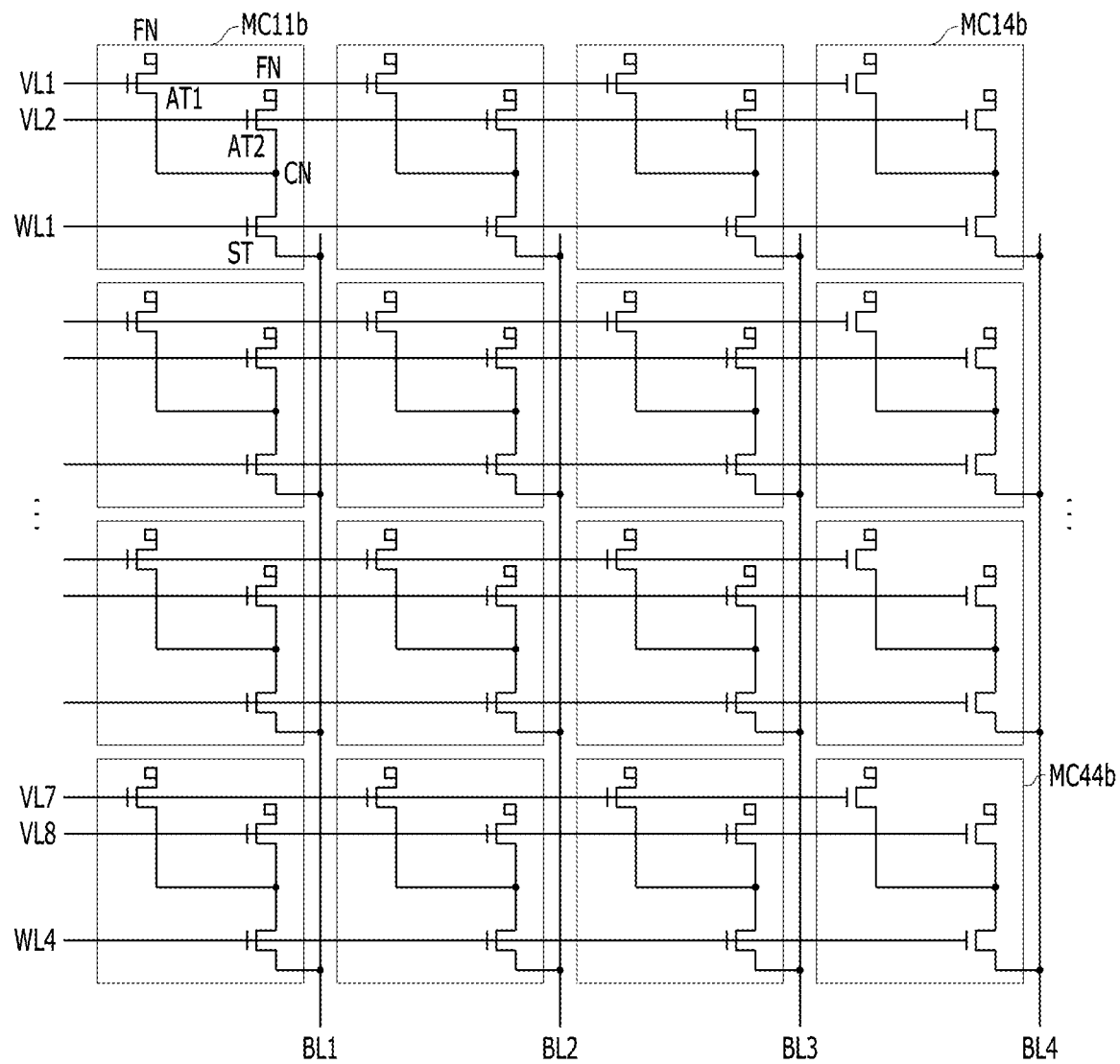
FIG. 3A is a circuit diagram illustrating the memory cell array of FIG. 1 in accordance with another embodiment of the present disclosure.

FIG. 3A is a circuit diagram illustrating a memory cell array 110b suitable for use as the memory cell array 110 of FIG. 1 in accordance with another embodiment of the prevent disclosure. As described above with reference to FIG. 2A, FIG. 3A also illustrates the memory cell array 110b having a 4*4 matrix shape. Therefore, the duplicated descriptions thereof will be omitted.

The memory cell array 110b may include a plurality of antifuse memory cells MC11b to MC44b which are coupled to a plurality of word lines WL1 to WL4, a plurality of voltage lines VL1 to VL8, and a plurality of bit lines BL0 to BL4. Specifically, each of the plurality of antifuse memory cells MC11b to MC44b is coupled to one of the plurality of word lines WL1 to WL4, a pair of the plurality of voltage lines VL1 to VL8, and one of the plurality of bit lines BL1 to BL4. In the embodiment shown in FIG. 3A, each of the antifuse memory cells MC11b to MC44b may include two antifuse transistors (e.g., first and second antifuse transistors AT1 and AT2) to be programmed and a single select transistor ST for selecting the antifuse transistors.

For the purpose of convenience, a configuration of the first antifuse memory cell MC11b will be described hereinafter. The first antifuse memory cell MC11b may include a first antifuse transistor AT1 and a second antifuse transistor AT2. The first antifuse transistor AT1 may be programmed according to a voltage applied to a first voltage line VL1, and the second antifuse transistor AT2 may be programmed according to a voltage applied to a second voltage line VL2. The first antifuse memory cell MC11b may further include a select transistor ST for selecting the first antifuse transistor AT1 and the second antifuse transistor AT2 according to a voltage applied to a first word line WL1. That is, the select transistor ST may be shared by the first and second antifuse transistors AT1 and AT2.

Specifically, the first and second antifuse transistors AT1 and AT2 may be coupled in parallel between a floating node FN and a common node CN. The first and second antifuse transistors AT1 and AT2 may have control terminals (e.g., gate terminals) coupled to the first and second voltage lines VL1 and VL2, respectively. Although the first and second antifuse transistors AT1 and AT2 are coupled to the same floating node FN in the embodiment shown in FIG. 3A, embodiments of the present disclosure are not limited thereto. For example, the first and second antifuse transistors AT1 and AT2 may be coupled to different floating nodes.

The select transistor ST may be coupled between the common node CN and the first bit line BL1. The select transistor ST may have a gate terminal coupled to the first word line WL1.

The first antifuse memory cell MC11$b$ may include two antifuse transistors AT1 and AT2. A program operation may be performed on the first and second antifuse transistors AT1 and AT2, rather than a single antifuse transistor, thereby improving reliability of the program operation and data stored therein. Furthermore, because the two antifuse transistors AT1 and AT2 share the single select transistor ST, a circuit area of the first antifuse memory cell MC11$b$ can be reduced, compared to that of the first antifuse memory cell MC11$a$ of FIG. 2A.

Figure 3B:
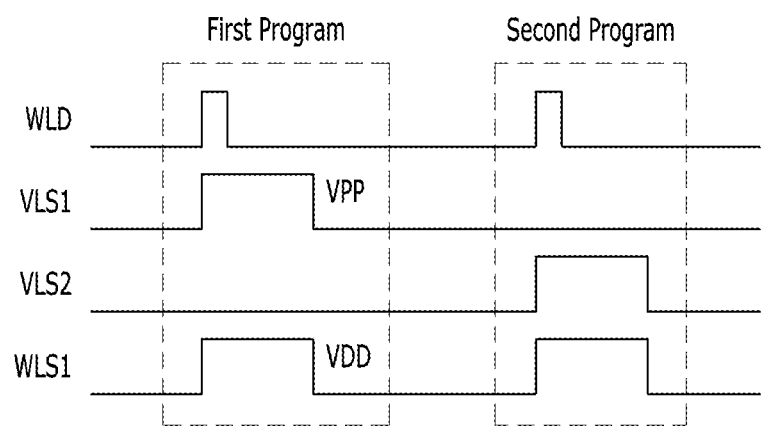
FIG. 3B includes waveforms illustrating a program operation of the memory cell array illustrated in FIG. 3A in accordance with an embodiment of the present disclosure.

FIG. 3B includes waveforms illustrating a program operation on the memory cell array 110$b$ illustrated in FIG. 3A in accordance with an embodiment of the present disclosure. For the purpose of convenience, FIG. 3B illustrates a program operation on the first antifuse memory cell MC11$b$.

During the program operation, when the first antifuse memory cell MC11$b$ is a target memory cell, the row decoder 130 in FIG. 1 may generate a word line driving signal WLD associated with the first antifuse memory cell MC11$b$ by decoding the row address RADD. The row decoder 130 may sequentially activate (or assert) the word line driving signal WLD twice during the program operation. For example, the row decoder 130 may sequentially generate two pulses each having a given pulse width in response to the row address RADD.

While the word line driving signal WLD is asserted twice, the voltage supply circuit 140 in FIG. 1 may sequentially supply a program voltage (e.g., the high voltage VPP), to the first and second voltage lines VL1 and VL2. That is, when the word line driving signal WLD is activated at a first time during a first program suboperation, the voltage supply circuit 140 may supply the high voltage VPP to the first voltage line VL1. Then, when the word line driving signal WLD is asserted at a second time during a second program suboperation, the voltage supply circuit 140 may supply the high voltage VPP to the second voltage line VL2.

When the word line driving signal WLD is asserted twice, the word line driving circuit 150 may drive the first word line WL1 to the level of a given voltage (e.g., the power supply voltage VDD). Whenever the word line driving signal WLD is asserted, the word line driving circuit 150 may enable (or drive) the first word line WL1 to the level of the power supply voltage VDD. For example, when the word line driving signal WLD is asserted at the first time during the first program suboperation, a first voltage line signal VLS1 is asserted to have the high voltage VPP and a first word line signal WLS1 is asserted to have the power supply voltage VDD. When the word line driving signal WLD is asserted at the second time during the second program suboperation, a second voltage line signal VLS2 is asserted to have the high voltage VPP and the first word line signal WLS1 is again asserted to have the power supply voltage VDD. When the first word line WL1 is driven, the first bit line BL1 coupled to the first antifuse memory cell MC11$b$ is selected in response to the column address CADD.

Therefore, during the program operation including the first and second program suboperations, the first antifuse memory cell MC11$b$ may turn on the select transistor ST twice, and sequentially program the first and second antifuse transistors AT1 and AT2. For this operation, when the first word line WL1 is driven at the first time, the high voltage VPP may be supplied to the first voltage line VL1. Then, when the first word line WL1 is driven at the second time, the high voltage VPP may be supplied to the second voltage line VL2.

A read operation may be performed on the first antifuse memory cell MC11$b$ in two steps, similarly to the above-described program operation, except that the voltage supply circuit 140 supplies a read voltage to the first and second voltage lines VL1 and VL2 according to the internal command signal CMDi applied from the control circuit 120. For example, during a first read suboperation, the select transistor ST is turned on in response to the first word line signal WLS1 asserted to have the power supply voltage VDD, and the first antifuse transistor AT1 receives the first voltage line signal VLS1 asserted to have the read voltage (not shown). During a second read suboperation, the select transistor ST is again turned on in response to the first word line signal WLS1 asserted to have the power supply voltage VDD, and the second antifuse transistor AT2 receives the second voltage line signal VLS2 asserted to have the read voltage (not shown). Through the read operation, the first antifuse memory cell MC11$b$ may be determined as being programmed when any one of the first and second antifuse transistors AT1 and AT2 or both of the first and second antifuse transistors AT1 and AT2 are determined as being programmed.

In accordance with an embodiment of the present disclosure, it is possible to compensate for an error which may occur during a program operation on any one of the first and second antifuse transistors AT1 and AT2. For example, when an error occurs during the first program suboperation on the first antifuse transistor AT1, the second antifuse transistor AT2 may be programmed without an error during the second program suboperation, and vice versa, thereby improving reliability of the programming operation on the first antifuse memory cell MC11$b$. Furthermore, when a defect occurs in the first and second antifuse transistors AT1 and AT2 during a fabrication process, the defect can be repaired.

Furthermore, because two antifuse transistors (e.g., the first and second antifuse transistors AT1 and AT2) share a single select transistor (e.g., the select transistor ST) in each (e.g., the first antifuse memory cell MC11$b$) of the plurality of antifuse memory cells MC11$b$ to MC44$b$, the total number of transistors and the total number of word lines can be reduced in a memory device (e.g., the memory device 100 in FIG. 1) including a memory cell array (e.g., the memory cell array 110$b$). In addition, the number of a plurality of word line driving signals (e.g., the word line driving signals WLD in FIG. 1) generated by decoding the row address RADD is decreased, which simplifies the structure of a logic circuit in a row decoder (e.g., the row decoder 130 in FIG. 1). Therefore, the entire area of the memory device 100 including the memory cell array 110$b$ and the row decoder 130 according to an embodiment of the present disclosure can be reduced compared to a conventional memory device.

Figure 4:
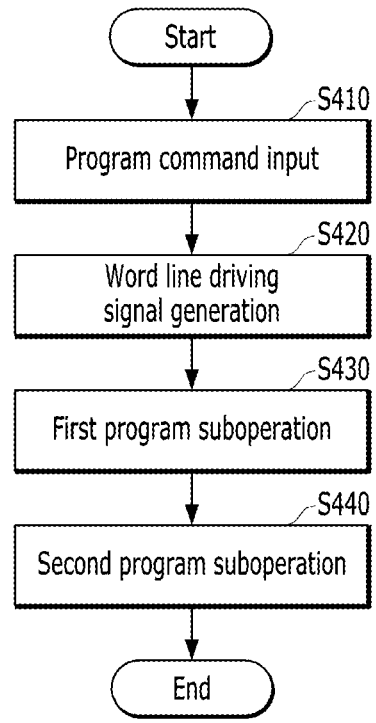
FIG. 4 is a flowchart illustrating an operation of a memory device in accordance with an embodiment of the present disclosure.

FIG. 4 is a flowchart illustrating an operation of a memory device (e.g., the memory device 100 in FIG. 1) in accordance with an embodiment of the prevent disclosure.

1) Receiving a program command at S410 will be described as follows. When a program operation is requested from a host (not illustrated), the memory device 100 may receive a command (e.g., the command CMD in FIG. 1) indicating the program operation. The memory device 100 may generate an internal command signal (e.g., the internal command signal CMDi in FIG. 1) for performing the program operation in response to the command CMD. In response to the internal command signal CMDi, a voltage supply circuit (e.g., the voltage supply circuit 140 in FIG. 1) may generate a program voltage (e.g., the high voltage VPP in FIG. 3B).

2) Generating a word line driving signal at S420 will be described as follows. A row decoder (e.g., the row decoder 130 in FIG. 1) may generate a word line driving signal (e.g., the word line driving signal WLD in FIG. 3B) associated with a target memory cell (e.g., the first antifuse memory cell MC11b in FIG. 3A) among a plurality of antifuse memory cells by decoding a row address RADD. During the program operation, when the row decoder 130 receives the internal command signal CMDi indicating the program operation from the control circuit 120, the row decoder 130 may assert the word line driving signal WLD at least twice. According to the asserted word line driving signal WLD, the target memory cell may be programmed at least twice.

3) Performing a first program suboperation at S430 will be described as follows: in response to the asserted word line driving signal WLD at a first time, a word line driving circuit (e.g., the word line driving circuit 150 in FIG. 1) may drive one word line (e.g., the first word line WL1 in FIG. 3A) coupled to the target memory cell (e.g., the first antifuse memory cell MC11b in FIG. 3A) among the plurality of word lines. When the word line coupled to the target memory cell is driven to a given voltage (e.g., the power supply voltage VDD in FIG. 3B), a select transistor (e.g., the select transistor ST in FIG. 3A) of the target memory cell may be turned on.

In response to the asserted word line driving signal at the first time, the voltage supply circuit may supply a program voltage to a first voltage line (e.g., the first voltage line VL1 in FIG. 3A) coupled to the target memory cell among the plurality of voltage lines. When a first antifuse transistor (e.g., the first antifuse transistor AT1 in FIG. 3A) of the target memory cell receives the program voltage through the first voltage line, a first program suboperation may be performed to form a conductive channel through a gate dielectric layer of the first antifuse transistor by a dielectric breakdown.

4) Performing a second program suboperation at S440 will be described as follows: in response to the activated word line driving signal at a second time, a word line driving circuit (e.g., the word line driving circuit 150 in FIG. 1) may again enable the word line coupled to the target memory cell among the plurality of word lines. When the word line coupled to the target memory cell is enabled, the select transistor of the target memory cell may be turned on again.

In response to the activated word line driving signal at the second time, the voltage supply circuit 140 may supply the program voltage to a second voltage line (e.g., the second voltage line VL2 in FIG. 3A) coupled to the target memory cell among the plurality of voltage lines. When a second antifuse transistor (e.g., the second antifuse transistor AT2 in FIG. 3A) of the target memory cell receives the program voltage through the second voltage line, a second program suboperation may be performed to form a conductive channel through a gate dielectric layer of the second antifuse transistor by a dielectric breakdown.

In accordance with embodiments of the present disclosure, a memory cell of a memory device may include a plurality of antifuse transistors for programming data to each of the plurality of antifuse transistors. Although an error occurs during a program suboperation on one of the plurality of antifuse transistors or a defect occurs in the antifuse transistor, one or more of the remaining antifuse transistors of the memory cell may preserve the programmed data, thereby improving the reliability of the program operation of the memory device and the reliability of the programmed data.

Furthermore, a select transistor functioning as a switch of the memory cell may be shared by the plurality of antifuse transistors. Therefore, it is possible to reduce the number of transistors included in the memory cell or the number of signals for controlling the transistors. As a result, the area of each of the plurality of memory cells, the area of a logic circuit for generating signals to control select transistors of the plurality of memory cells, and the area of signal lines for transferring the generated signals can be reduced, which reduces the entire area of the memory device.

Although various embodiments have been described for illustrative purposes, it will be apparent to those skilled in the art that various changes and modifications may be possible.

What is claimed is:

1. A memory device comprising:
a memory cell array comprising a plurality of antifuse memory cells coupled to a plurality of word lines, a plurality of voltage lines, and a plurality of bit lines; and
a first decoder suitable for generating a word line driving signal associated with a target memory cell among the plurality of antifuse memory cells in response to a first address, and asserting the word line driving signal at least twice during a program operation.

2. The memory device of claim 1, further comprising:
a voltage supply circuit suitable for supplying a program voltage or a read voltage, or both through two or more of the plurality of voltage lines in response to the word line driving signal; and
a word line driving circuit suitable for driving one or more of the plurality of word lines in response to the word line driving signal.

3. The memory device of claim 2, wherein each of the plurality of antifuse memory cells comprises:
two or more antifuse transistors coupled to the voltage supply circuit through respective two or more voltage lines among the plurality of voltage lines; and
a select transistor coupled to the word line driving circuit through a single word line among the plurality of word lines.

4. The memory device of claim 3, wherein the two or more antifuse transistors are coupled in parallel between a floating node and a common node, and the select transistor is coupled between the common node and a single bit line among the plurality of bit lines.

5. The memory device of claim 3, wherein during the program operation, the voltage supply circuit supplies the program voltage to a first voltage line coupled to the target memory cell when the word line driving signal is asserted at a first time.

6. The memory device of claim 5, wherein during the program operation, the voltage supply circuit supplies the program voltage to a second voltage line coupled to the target memory cell when the word line driving signal is asserted at a second time.

7. The memory device of claim 3, wherein during the program operation, the word line driving circuit asserts a word line signal transmitted through the word line coupled to the target memory cell whenever the word line driving signal is asserted at least twice.

8. The memory device of claim 2, further comprising:
a second decoder suitable for generating a bit line select signal associated with the target memory cell among the plurality of antifuse memory cells in response to a second address; and
a sense amplifier circuit suitable for sensing and amplifying data of the target memory cell in response to the bit line select signal.

9. A memory cell comprising:
first and second antifuse transistors coupled in parallel between a floating node and a common node; and
a select transistor coupled between the common node and a bit line,
wherein the select transistor is turned on at first and second times to sequentially program the first and second antifuse transistors during a program operation.

10. The memory cell of claim 9, wherein the first and second antifuse transistors have gate terminals coupled to first and second voltage lines, respectively, among a plurality of voltage lines.

11. The memory cell of claim 10, wherein the select transistor has a gate terminal coupled to a given word line among a plurality of word lines.

12. The memory cell of claim 11, wherein the program operation includes first and second program sub-operations, and
wherein the gate terminal of the first antifuse transistor receives a program voltage through the first voltage line when a word line signal transmitted through the given word line is asserted to have a given voltage at the first time during the first program sub-operation.

13. The memory cell of claim 12, wherein the gate terminal of the second antifuse transistor receives the program voltage through the second voltage line when the word line signal transmitted through the given word line is asserted to have the given voltage at the second time during the second program sub-operation.

14. A method for operating a memory device, the method comprising:
generating a word line driving signal associated with a target memory cell among a plurality of memory cells in response to a row address, wherein the word line driving signal is asserted at least twice during a program operation, the program operation including first and second programming sub-operations;
performing the first programming sub-operation on the target memory cell in response to the word line driving signal asserted at a first time; and
performing the second programming sub-operation on the target memory cell in response to the word line driving signal asserted at a second time.

15. The operation method of claim 14, further comprising generating a program voltage in response to a program command during the program operation.

16. The operation method of claim 15, wherein performing the first programming sub-operation on the target memory cell comprises:
driving a single word line coupled to the target memory cell among a plurality of word lines in response to the word line driving signal asserted at the first time; and
asserting a first voltage line signal to have the program voltage in response to the word line driving signal asserted at the first time and providing the first voltage line signal through a first voltage line coupled to the target memory cell among a plurality of voltage lines.

17. The operation method of claim 16, wherein performing the second programming sub-operation on the target memory cell comprises:
driving the single word line coupled to the target memory cell among the plurality of word lines in response to the word line driving signal asserted at the second time; and
asserting a second voltage line signal to have the program voltage in response to the word line driving signal asserted at the second time and providing the second voltage line signal through a second voltage line coupled to the target memory cell among the plurality of voltage lines.

18. The operation method of claim 15, wherein performing the first programming sub-operation on the target memory cell comprises:
turning on a select transistor of the target memory cell in response to the word line driving signal asserted at the first time; and
supplying the program voltage to a first antifuse transistor of the target memory cell in response to the word line driving signal asserted at the first time.

19. The operation method of claim 18, wherein performing the second programming sub-operation on the target memory cell comprises:
turning on the select transistor of the target memory cell in response to the word line driving signal asserted at the second time; and
supplying the program voltage to a second antifuse transistor of the target memory cell in response to the word line driving signal asserted at the second time.

20. The operation method of claim 19, wherein the first and second antifuse transistors are coupled in parallel to each other between a floating node and a common node, and the select transistor is coupled between the common node and a single bit line among a plurality of bit lines.

* * * * *